(12) United States Patent
Hong et al.

(10) Patent No.: US 9,666,831 B2
(45) Date of Patent: May 30, 2017

(54) ORGANIC LIGHT EMITTING DISPLAY DEVICE

(71) Applicant: SAMSUNG DISPLAY CO., LTD., Yongin, Gyeonggi-Do (KR)

(72) Inventors: Sangmin Hong, Yongin (KR); Jungi Youn, Yongin (KR); Goeun Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 10 days.

(21) Appl. No.: 14/680,324

(22) Filed: Apr. 7, 2015

(65) Prior Publication Data

US 2016/0111677 A1    Apr. 21, 2016

(30) Foreign Application Priority Data

Oct. 17, 2014  (KR) .......................... 10-2014-0141195

(51) Int. Cl.
*H01L 51/52*       (2006.01)

(52) U.S. Cl.
CPC .................................. *H01L 51/5246* (2013.01)

(58) Field of Classification Search
CPC ............. H01L 27/3258; H01L 51/5246; H01L 51/5296; H01L 51/525; H01L 51/5243; H01L 23/10; H01L 51/5253; H01L 51/524; H01L 27/327; H01L 51/5237; H01L 26/206; G02F 1/0333; G02F 1/133348; G02F 2001/133368; G02F 1/133382; G02F 1/136209; G02F 21/29; G02F 1/2955; G02F 1/3523
See application file for complete search history.

(56) References Cited

U.S. PATENT DOCUMENTS

| 9,076,745 B2* | 7/2015 | Choi .................... H01L 51/5246 |
| 2010/0102719 A1 | 4/2010 | Lee et al. |
| 2012/0099061 A1* | 4/2012 | Lee ........................ G02F 1/1339 |
| | | 349/110 |
| 2012/0224342 A1 | 9/2012 | Kim et al. |
| 2012/0319123 A1* | 12/2012 | Han .................... H01L 51/5246 |
| | | 257/72 |

(Continued)

FOREIGN PATENT DOCUMENTS

| JP | 2013-61663 A | 4/2013 |
| JP | 5243665 B2 | 7/2013 |

(Continued)

*Primary Examiner* — Daniel Luke
*Assistant Examiner* — Khatib Rahman
(74) *Attorney, Agent, or Firm* — Lee & Morse, P.C.

(57) ABSTRACT

An organic light emitting display device includes first and second substrates, a display unit on the first substrate, a metal layer on the first substrate and including a plurality of first straight and curved portions arranged to surround the display area, and a sealant bonding the first substrate and the second substrate, the sealant at least partially being on the metal layer and including a plurality of second straight and curved portions arranged to surround the display area, wherein the metal layer includes an inner area facing toward the display unit and an outer area outside the inner area in a width direction, the inner area in the first curved portions being thinner in the width direction than the inner area in the first straight portions.

14 Claims, 13 Drawing Sheets

(56) References Cited

U.S. PATENT DOCUMENTS

| | | |
|---|---|---|
| 2013/0134401 A1 | 5/2013 | Murakami et al. |
| 2013/0137200 A1* | 5/2013 | Shimomura ........ H01L 33/0095 |
| | | 438/26 |
| 2013/0302929 A1 | 11/2013 | Hara et al. |
| 2014/0027743 A1 | 1/2014 | Nishido |
| 2015/0123092 A1* | 5/2015 | Kikuchi .............. H01L 51/5246 |
| | | 257/40 |
| 2015/0236297 A1 | 8/2015 | Hong et al. |

FOREIGN PATENT DOCUMENTS

| | | |
|---|---|---|
| JP | 2014-44936 A | 3/2014 |
| KR | 10-2005-0019273 A | 3/2005 |
| KR | 10-2006-0072745 A | 6/2006 |
| KR | 10-2012-0047585 A | 5/2010 |
| KR | 10-2012-0100307 A | 9/2012 |
| KR | 10-2015-009884 A | 8/2015 |
| WO | WO 2012/105189 A1 | 8/2012 |

* cited by examiner

ORGANIC LIGHT EMITTING DISPLAY DEVICE

CROSS-REFERENCE TO RELATED APPLICATION

Korean Patent Application No. 10-2014-0141195, filed on Oct. 17, 2014, in the Korean Intellectual Property Office, and entitled: "Organic Light Emitting Display Device," is incorporated by reference herein in its entirety.

BACKGROUND

1. Field

One or more embodiments relate to an organic light emitting display device.

2. Description of the Related Art

In general, a display device, e.g., an organic light-emitting display device including a thin film transistor (TFT), is spotlighted since the display device may be used in mobile display devices, e.g., smart phones, tablet personal computers (PCs), ultra-slim notebooks, digital cameras, video cameras, and personal digital assistants (PDAs), or in electric/electronic products, e.g., ultra-thin TVs. The organic light-emitting display device needs to seal upper and lower substrates in order to protect an organic light emitting unit from the outside. To this end, a sealing member is coated between the upper and lower substrates and cured, thereby bonding the upper and lower substrates to each other. In this regard, lifetime and reliability of a display are determined according to a bonding degree of the upper and lower substrates by the sealing member.

SUMMARY

According to one or more embodiments, an organic light emitting display device includes a first substrate, a second substrate facing the first substrate, a display unit defining a display area on the first substrate, a metal layer on the first substrate, the metal layer including a plurality of first straight portions, and a plurality of first curved portions connecting the plurality of first straight portions, the plurality of first straight and curved portions of the metal layer being arranged to surround the display area, and a sealant bonding the first substrate and the second substrate, the sealant at least partially being on the metal layer and including a plurality of second straight portions, and a plurality of second curved portions connecting the plurality of second straight portions, the plurality of second straight and curved portions of the sealant being arranged to surround the display area, wherein the metal layer includes an inner area facing toward the display unit and an outer area outside the inner area in a width direction, the inner area in the first curved portions being thinner in the width direction than the inner area in the first straight portions.

In one embodiment, a groove may be formed in the inner area of the plurality of curve portions of the metal layer.

In one embodiment, widths of the plurality of curve portions of the metal layer may be smaller than widths of the plurality of straight portions of the metal layer.

In one embodiment, a width of the inner area of the plurality of curve portions of the metal layer may be smaller than a width of the inner area of the plurality of straight portions of the metal layer.

In one embodiment, the sealant may include an inner area disposed toward the display unit and an outer area disposed outside the inner area in a width direction, and when a laser beam is radiated onto the sealant, an amount of heat transferred to the plurality of curve portions of the sealant from the metal layer may be smaller in the inner area of the sealant than in the outer area of the sealant.

In one embodiment, when the laser beam is radiated onto the sealant, an amount of heat transferred to the plurality of straight portions of the sealant from the metal layer may be substantially the same in the inner area of the sealant and in the outer area of the sealant.

In one embodiment, the organic light emitting display device may further include: an insulating layer disposed between the first substrate and the sealant and at least partially covering the metal layer.

In one embodiment, the insulating layer may be formed to cover the plurality of curve portions of the metal layer, and wherein a trench into which the sealant is inserted may be formed in a location of the inner area of the metal layer corresponding to at least the partially removed area.

In one embodiment, the insulating layer may be formed to cover the plurality of curve portions of the metal layer, and include a plurality of openings into which the sealant is inserted, and wherein a width of the trench may be equal to or greater than two times of a width of an outermost opening from among the plurality of openings.

In one embodiment, a low conductivity member formed of a material having a thermal conductivity, which is lower than a thermal conductivity of the outer area of the plurality of curve portions of the metal layer, may be disposed in the inner area of the plurality of curve portions of the metal layer.

In one embodiment, the sealant may further include: a first extension sealant overlapping with at least a part of a signal wiring for applying a signal to the display unit.

In one embodiment, the plurality of curve portions of the sealant may further include: a second extension sealant disposed outside the plurality of curve portions of the metal layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
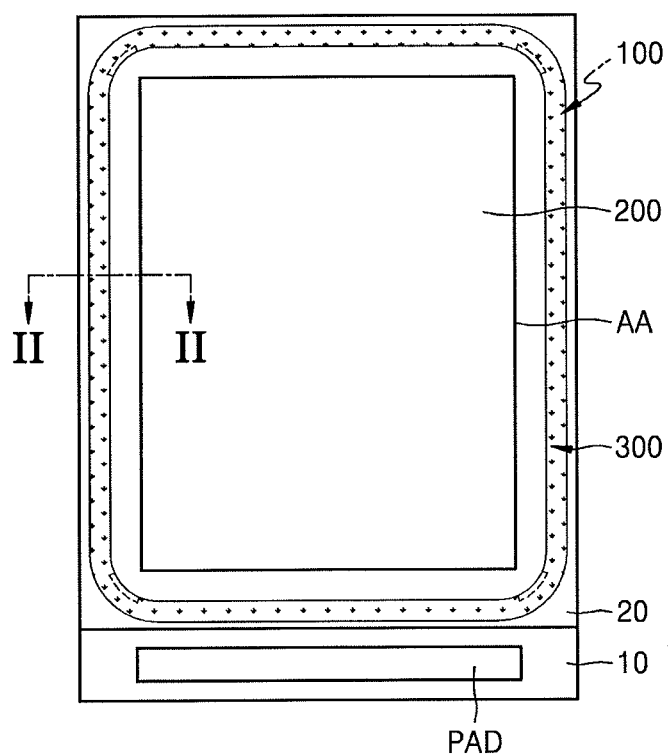
FIG. 1 illustrates a schematic plan view of an organic light emitting display device, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of elements, layers, and regions may be exaggerated for clarity of illustration. It will also be understood that when a layer or element is referred to as being "on" another element or substrate, it can be directly on the other element or substrate, or intervening elements may also be present. In addition, it will also be understood that when an element is referred to as being "between" two elements, it can be the only element between the two elements, or one or more intervening elements may also be present. Like reference numerals refer to like elements throughout.

It will also be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

As used herein, the term "and/or" includes any and all combinations of one or more of the associated listed items. Expressions such as "at least one of," when preceding a list of elements, modify the entire list of elements and do not modify the individual elements of the list.

Figure 2:
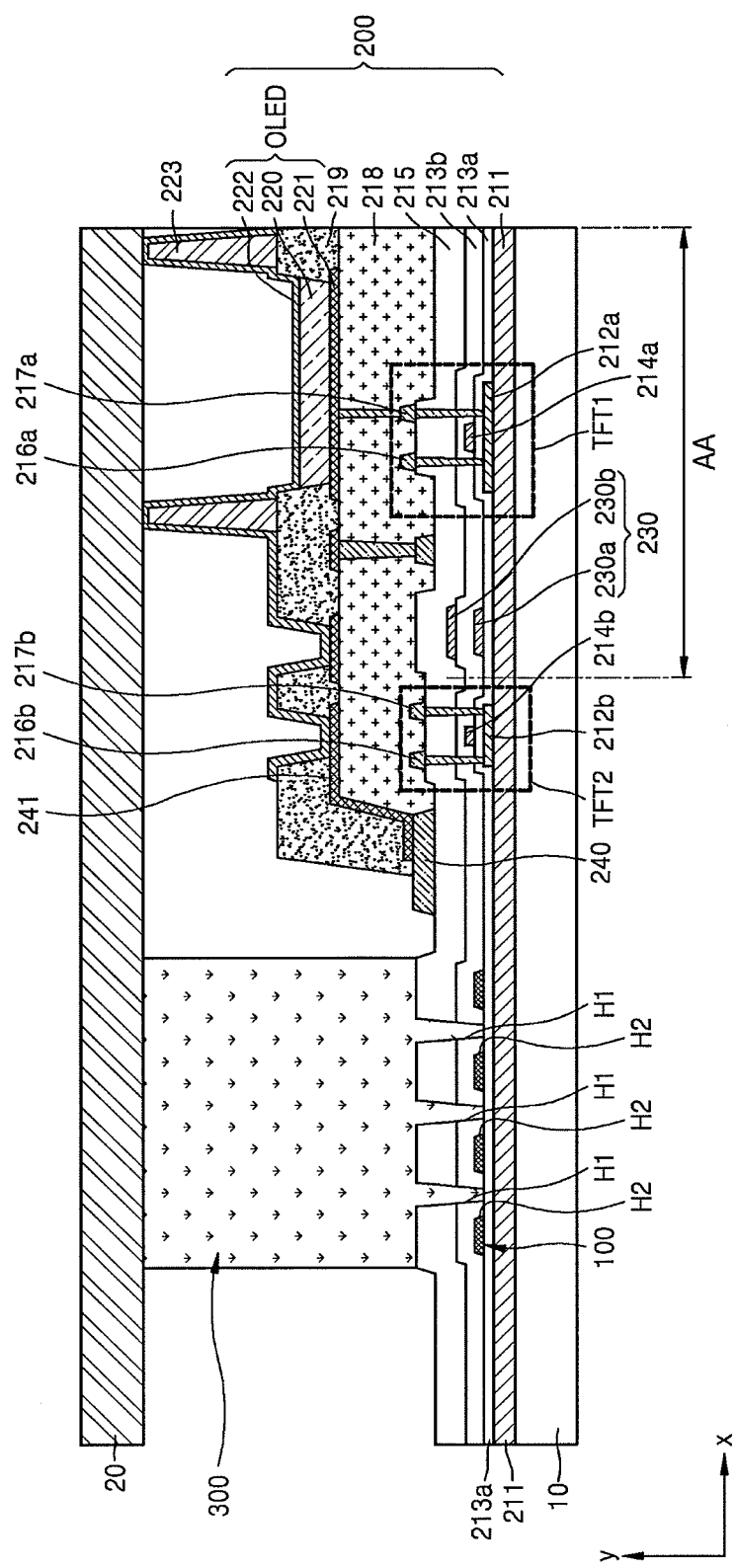
FIG. 2 illustrates an example of a cross-sectional view taken along line II-II of the organic light emitting display device of FIG. 1.

FIG. 1 illustrates a schematic plan view of an organic light emitting display device 1, according to an embodiment. FIG. 2 is an example of a cross-sectional view taken along line II-II of the organic light emitting display device 1 of FIG. 1.

Referring to FIGS. 1 and 2, the organic light emitting display device 1 according to an embodiment may include a first substrate 10, a second substrate 20 disposed to face the first substrate 10, and a sealant 300 disposed between the first substrate 10 and the second substrate 20 and bonding the first substrate 10 and the second substrate 20 to each other.

The first substrate 10 may be, e.g., a glass substrate having rigidity, a polymer substrate, a film having flexibility, a metal substrate, or a combination substrate of these. For example, the first substrate 10 may be a flexible substrate, and may be formed of a plastic material having excellent heat resistance and durability.

The second substrate 20 may be provided as a transparent member. Accordingly, an image formed on the display unit 200 may be exposed to the outside through the second substrate 20. In some embodiments, the second substrate 20 may further include an on-cell touch screen panel on which a touch screen pattern is formed so as to act as a touch panel. A polarization film, a color filter, or a protection window may be further provided on the second substrate 20.

The display unit 200 is provided on the first substrate 10. The display unit 200 defines a display area AA on the first substrate 10, and includes an organic light emitting diode OLED. Meanwhile, a pad unit PAD is disposed around the display area AA so that an electrical signal may be transmitted to the display area AA from a power supply device or a signal generation device.

The display unit 200 and a structure for sealing the display unit 200 will be described in more detail with reference to FIG. 2 below.

A buffer layer 211 may be formed on the first substrate 10. The buffer layer 211 may be formed on an entire surface of both the first substrate 10, i.e. the display area AA, and a perimeter of the display area AA. The buffer layer 211 may prevent impure elements from penetrating through the first substrate 10, and may provide a planar surface to an upper portion of the first substrate 10. The buffer layer 211 may be formed of various materials used to perform the above functions.

Insulating layers 213a, 213b, and 215 may be formed on the first substrate 210. The insulating layers 213a, 213b, and 215 may be composed of gate insulating films 213a and 213b and an interlayer insulating film 215.

Thin film transistors TFT1 and TFT2 may be formed on the buffer layer 211. The first thin film transistor TFT1 includes a first active layer 212a, a first gate electrode 214a, a first source electrode 216a, and a first drain electrode 217a. The first gate insulating film 213a for insulating the first gate electrode 214a and the first active layer 212a is disposed between the first gate electrode 214a and the first active layer 212a. The first gate electrode 214a is formed to overlap with a part of the first active layer 212a on the first gate insulating film 213a. The first thin film transistor TFT1 may be disposed in a lower portion of the organic light emitting diode OLED, and may be a driving thin film transistor that drives the organic light emitting diode OLED.

The second thin film transistor TFT2 includes a second active layer 212b, a second gate electrode 214b, a second source electrode 216b, and a second drain electrode 217b. The first gate insulating film 213a for insulating the second active layer 212b and the second gate electrode 214b is disposed between the second active layer 212b and the second gate electrode 214b. The second gate electrode 214b is formed to overlap with a part of the second active layer 212b on the first gate insulating film 213a.

The first active layer 212a and the second active layer 212b may be provided on the buffer layer 211. The first active layer 212a and the second active layer 212b may be formed as an inorganic semiconductor, e.g., amorphous silicon or poly silicon or an organic semiconductor. In some embodiments, the first semiconductor active layer 204 and the second semiconductor active layer 210 may be formed of an oxide semiconductor. For example, the first active layer 212a may be formed as an oxide semiconductor. For example, the oxide semiconductor may include an oxide of a material of Group 4, 12, 13, and 14 metal elements, e.g., zinc (Zn), indium (In), gallium (Ga), tin (Sn), cadmium (Cd), germanium (Ge), and hafnium (Hf), and a combination of these.

The first gate insulating film 213a is provided on the buffer layer 211 to cover the first active layer 212a and the second active layer 212b. The second gate insulating film 213b is formed to cover the first gate electrode 214a and the second gate electrode 214b.

The first gate electrode 214a and the second gate electrode 214b may include a single layer or a layer stack including, e.g., gold (Au), silver (Ag), copper (Cu), nickel (Ni), platinum (Pt), palladium (Pd), aluminum (Al), molybdenum (Mo), chromium (Cr), etc., or may include an alloy, e.g., Al:Nd, Mo:W, etc.

The first gate insulating film 213a and the second gate insulating film 213b may include an inorganic film, e.g., silicon oxide, silicon nitride, or metal oxide, and may have a single layer or multilayer structure.

The interlayer insulating film 215 is formed on the second gate insulating film 213b. The interlayer insulating film 215 may be formed as an inorganic film, e.g., silicon oxide, silicon nitride, or etc. The interlayer insulating film 215 may include an organic film.

The first source electrode 216a and the first drain electrode 217a are formed on the interlayer insulating film 215. The first source electrode 216a and the first drain electrode 217a contact the first active layer 212a through contact holes. The first source electrode 216a and the first drain electrode 217a are formed on the interlayer insulating film 215, and contact the second active layer 212b through contact holes. The first source electrode 216a, the second source electrode 216b, the first drain electrode 217a, and the second drain electrode 217b may include, e.g., metal, an alloy, metal nitride, conductive metal oxide, a transparent conductive material, etc.

A capacitor 230 may be included in the display area AA. The capacitor 230 may store a data signal supplied to the display unit 200 or compensate for a voltage drop of the display unit 200. The capacitor 230 may include a first capacitor electrode 230a, a second capacitor electrode 230b, and the second gate insulating film 213b disposed between the first capacitor electrode 230a and the second capacitor electrode 230b. The first capacitor electrode 230a and the second gate electrode 214b may be formed of a same material. The second capacitor 230b may be formed of the same material as that of the first gate electrode 214a.

A planarization film 218 covers the thin film transistors TFT1 and TFT2 and the capacitor 130, and is provided on the interlayer insulating film 215. The planarization layer 218 may function to remove a step difference between thin films and planarize the thin films so as to increase emission efficiency of the organic light emitting diode OLED that is to be formed thereon. The planarization film 218 may include a through hole exposing a part of the first drain electrode 217a.

The planarization layer 218 may be provided as an insulator. For example, the planarization layer 218 may be formed as a single layer or a multilayer stack including, e.g., an inorganic material, an organic material, or an organic/inorganic compound, and may be formed by using various deposition methods. In some embodiments, the planarization layer 218 may be formed of one or more materials selected from the group consisting of, e.g., polyacrylates resin, epoxy resin, phenolic resin, polyamides resin, poly- imides rein, unsaturated polyesters resin, poly phenylenethers resin, poly phenylenesulfides resin, and benzocyclobutene (BCB).

The present embodiment is not limited to the structure described above. For example, one of the planarization film 218 and the interlayer insulating film 215 may be omitted according to circumstances.

The organic light emitting diode OLED is formed on the planarization layer 218, and may include a first electrode 221, an intermediate layer 220 including an emissive layer, and a second electrode 222. A pixel defining film 219 is disposed to cover a part of the planarization layer 218 and the first electrode 221, and defines a pixel area PA and a non-pixel area NPA.

Holes and electrons injected from the first electrode 221 and the second electrode 222 of the organic light emitting diode OLED are combined in the emissive layer of the intermediate layer 220 to generate light. For example, the intermediate layer 220 may include the emissive layer. In another example, the intermediate layer 220 may include the emissive layer and at least one of a hole injection layer (HIL), a hole transport layer (HTL), an electron transport layer (ETL), and an electron injection layer (EIL). However, the present embodiment is not limited thereto, e.g., the intermediate layer 220 may include the emission layer and may further include other various functional layers.

The second electrode 222 may be formed on the intermediate layer 220. The second electrode 222 and the first electrode 221 form an electric field to allow light to emit from the intermediate layer 220. The first electrode 221 may be patterned for each pixel. The second electrode 222 may be formed to apply a common voltage to all pixels. The second electrode 222 may be electrically connected to a signal wiring 240 disposed at an edge of the display area AA through a connection wiring 241.

The first electrode 221 and the second electrode 222 may be provided as transparent electrodes or reflective electrodes. The first electrode 221 and the second electrode 222 may function as an anode and a cathode, respectively, but are not limited thereto. For example, the first electrode 221 and the second electrode 222 may function as the cathode and the anode, respectively.

Although one organic light emitting diode OLED is illustrated, a display area AA may include a plurality of organic light emitting diodes OLED. Each of the organic light emitting diodes OLEDs may form, e.g., define, one pixel. Each of the pixels may form, e.g., emit, red, green, blue or white colors.

A protection layer may be provided on the second electrode 222, and may function to cover and protect the organic light emitting diode OLED. The protection layer may use an inorganic insulating layer and/or an organic insulating layer.

A spacer 223 may be disposed between the first substrate 10 and the second substrate 20, and may maintain a space between the first substrate 10 and the second substrate 20. The spacer 223 may be provided such that display characteristic may not deteriorate due to an external shock.

In some embodiments, the spacer 223 may be formed on the pixel defining film 219. The spacer 223 may be provided to protrude toward the second substrate 30 from the pixel defining film 219. In some embodiments, the pixel defining film 219 and the spacer 223 may be integrally formed by using a photoconductive material via photography or photography etching. That is, a half-tone mask may be used to adjust an exposure amount via an exposure process and simultaneously form the pixel defining film 219 and the spacer 223.

The second electrode 222 and/or the protection layer may be provided on the spacer 223.

The circuit patterns 240 and 241, i.e., the signal wiring 240 and the connection wiring 241, are formed on the perimeter of the display area AA, and include the signal wiring 240 and the connection wiring 241 that electrically connects the signal wiring 240 to the display unit 200.

The signal wiring 240 may be formed on the interlayer insulating film 215. The signal wiring 240 may be on the perimeter of the display area AA. The signal wiring 240 may be electrically connected to the second electrode 222 via the connection wiring 241 to supply a signal to the second electrode 222.

The signal wiring 240 may be a cathode power line ELVSS. When the signal wiring 240 is the cathode power line ELVSS, the cathode power line ELVSS may be connected to a cathode power having a voltage lower than a common power voltage, e.g., a ground voltage or a negative (−) voltage.

A sealant 300 is disposed between the first substrate 10 and the second substrate 20 to, e.g., completely, surround the display area AA. The sealant 300 is disposed on the insulating layers 213a, 231b, and 215.

The sealant 300 may include an inorganic material. For example, the sealant 300 may include glass fit. The sealant 300 may be formed by using a dispenser or screen printing. The glass frit generally means a power type glass material but is not limited thereto. For example, the glass frit may be provided in the form of paste obtained by adding a laser or infrared absorber, an organic binder, and a filler for reducing a thermal expansion coefficient to a main material, e.g., $SiO_2$.

The sealant 300 is melted by a laser beam and then hardened. Thus, the first substrate 20 and the second substrate 30 may be bonded to each other.

The laser beam radiated onto the sealant 300 may be different in an energy distribution between a center area and a perimeter, i.e., peripheral, area. For example, energy of the center area of the laser beam may be greater than that of the perimeter area thereof. Accordingly, the center area of the sealant 300 on which the laser beam is radiated may be heated at a higher temperature than the perimeter area. . As such, the center area of the sealant 300 may be melted to a higher degree by the laser beam than the perimeter area of the sealant 300. In other words, the perimeter, e.g., peripheral, area of the sealant 300 may be insufficiently melted due to lower energy applied thereto, i.e., the sealant 300 may be melted non-uniformly.

Accordingly, in view of the insufficient melting of the peripheral area of the sealant 300, a metal layer 100 may be provided in a lower portion of the sealant 300. The metal layer 100 may be disposed between the first substrate 10 and the sealant 300. For example, the metal layer 100 may be formed on the buffer layer 211.

The metal layer 100 may include metal having an excellent thermal conductivity. For example, the metal layer 100 may include at least one of Au, Ag, Cu, Ni, Pt, Pd, Al, Mo, and Cr. The metal layer 100 may be formed of the same material as that of the gate electrodes 214a and 214b during the same process. A thermal conductivity of the metal layer 100 may be higher than that of the sealant 300.

The metal layer 100 is heated by heat received from the center area of the sealant 300, i.e., an area being at a high temperature, and transfers heat to the perimeter area of the sealant 300, i.e., an area having a low temperature relative to the center area of the sealant 300. That is, heat is transferred from the center area of the sealant 300 to the perimeter area of the sealant 300 through the metal layer 100. Thus, a temperature difference between the center area and the perimeter area of the sealant 300 may be reduced.

For example, for further improving bonding by the sealant 300, a plurality of openings H1 may be formed in the second gate insulating film 213b and the interlayer insulating film 215, as illustrated in FIG. 2, so the sealant 300 may fill the openings H1 to contact a same layer as the metal layer 100, e.g., to directly contact the first gate insulating film 213a. As such, a contact area of the sealant 300 may be increased through, e.g., sidewalls of, the openings H1, thereby increasing a bonding force. A plurality of openings H2 may be formed in the metal layer 100 corresponding to the openings H1, e.g., each openings H1 may overlap a corresponding openings H2, so a portion of the sealant 300 filling each opening H1 may also extend through a corresponding opening H2. Sizes of the openings H2 may be greater, e.g., wider along the x-axis, than those of the openings H1.

Figure 3:
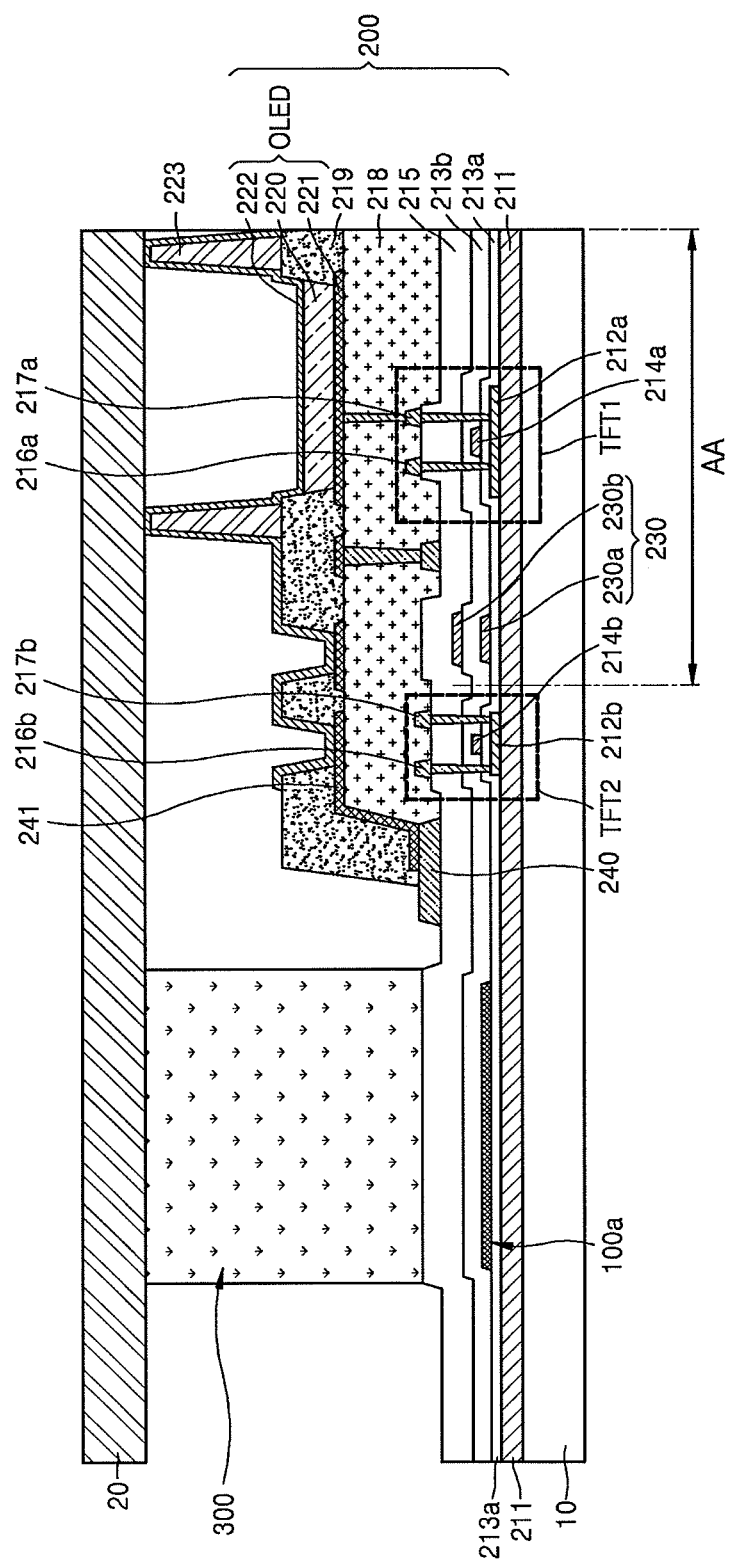
FIG. 3 illustrates another example of a cross-sectional view taken along line II-II of the organic light emitting display device of FIG. 1.

Meanwhile, a structure of forming the openings H1 is not limited thereto, and may be formed to penetrate into at least one of the second gate insulating film 213b and the interlayer insulating film 215. In another example, as illustrated in FIG. 3, the openings H1 and H2 are selective structures and may not be formed, so a metal layer 100a continuously overlaps a bottom of the sealant 300, i.e., without openings H2.

Figure 4:
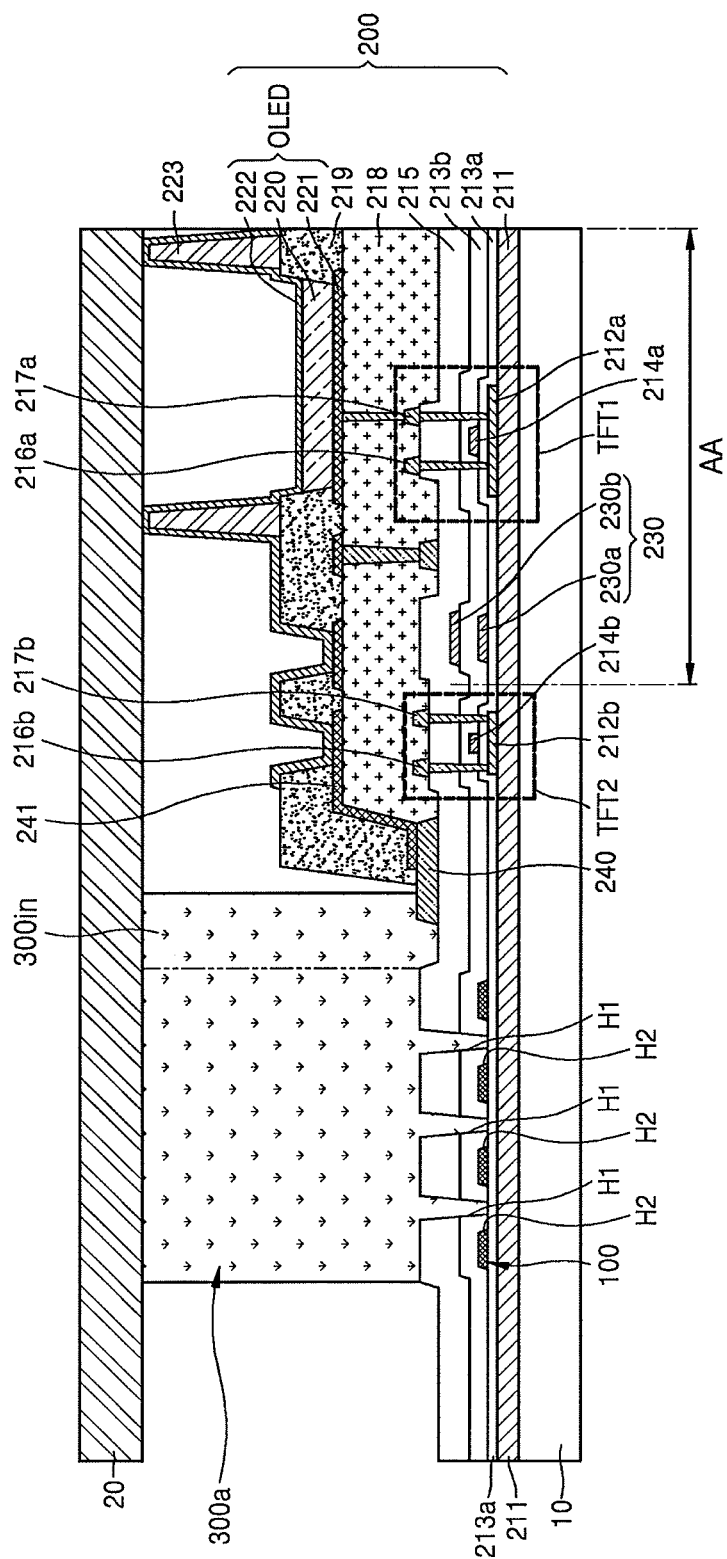
FIG. 4 illustrates a cross-sectional view for explaining a sealant of an organic light emitting display device.

FIG. 4 illustrates a cross-sectional view for explaining a sealant 300a of an organic light emitting display device. Referring to FIG. 4, an example of improving a bonding force of the first and second substrates 10 and 20 by the sealant 300a may further include a first extension sealant 300in extending in an inner direction, i.e., toward the signal wiring 240, so as to overlap with at least a part of the circuit patterns 240 and 241. A contact area by the sealant 300a may be extended by the first extension sealant 300in, i.e., increase in the x-axis direction, thereby increasing the bonding force of the first and second substrates 10 and 20.

Figure 5A:
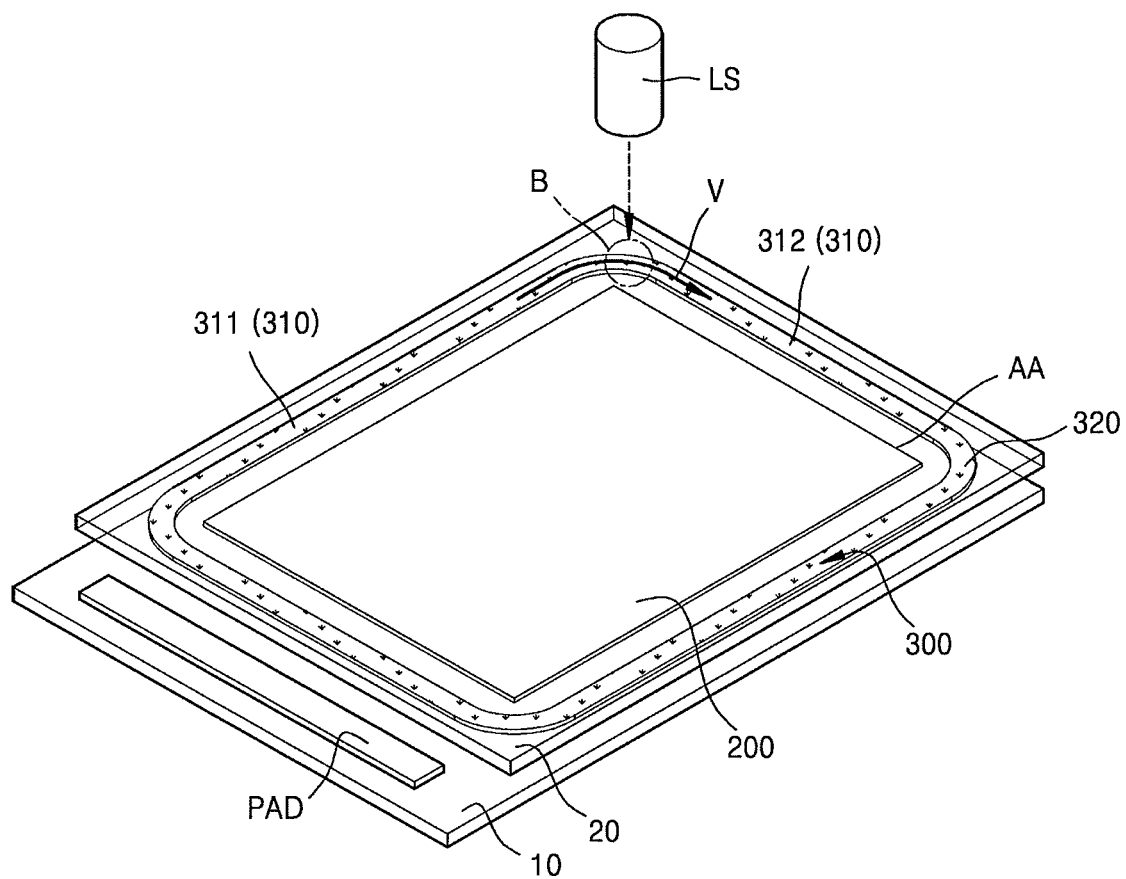
FIGS. 5A and 5B illustrate perspective and plan views, respectively, for explaining a process of cohering first and second substrates of the organic light emitting display device of FIG. 1.
Figure 5B:
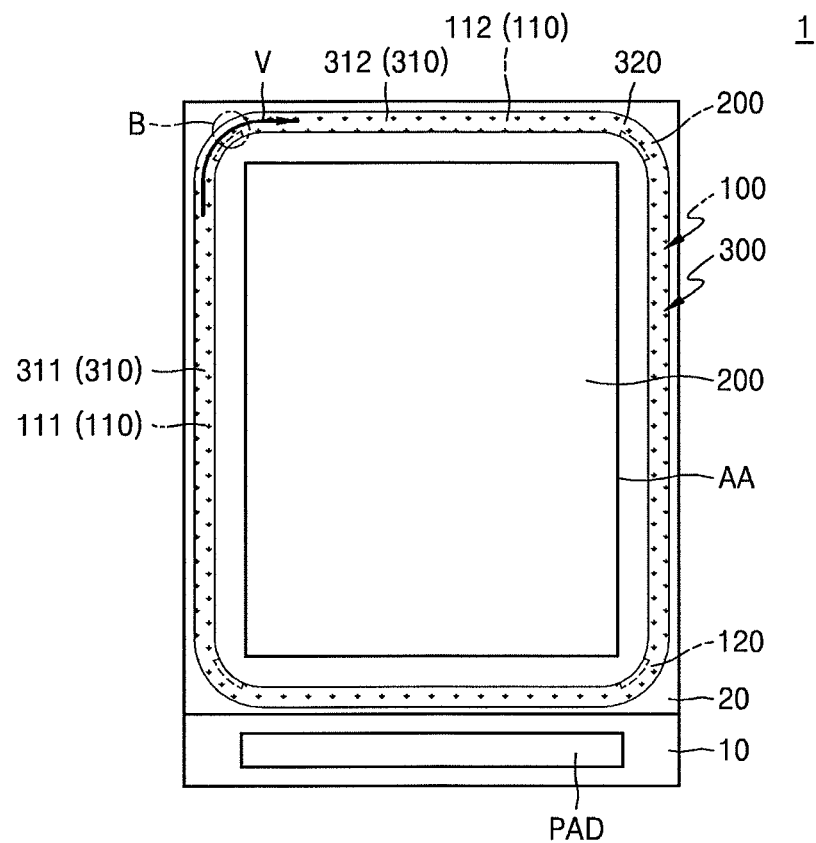

FIGS. 5A and 5B illustrate perspective and plan views, respectively, for explaining a process of bonding the first and second substrates 10 and 20 of the organic light emitting display device 1 of FIG. 1. Referring to FIGS. 5A and 5B, laser sources LS are spaced on, i.e., above, the second substrate 20. The laser sources LS radiate a laser beam B toward the sealant 300 to heat and melt the sealant 300.

The sealant 300 is formed to extend and surround the display area AA. The sealant 300 includes a plurality of straight portions 310 formed to extend in a straight, i.e., linear, shape (or manner) and a plurality of curved portions 320 formed to extend in a curved shape (or manner) to connect the plurality of straight portions 310.

The straight portions 310 may include a first straight potion 311 and a second straight portion 312 extending in a direction perpendicular to the direction of the first straight portion 311. A length of the second straight portion 312 may be different from that of the first straight portion 311. For example, as illustrated in FIG. 5A, each curved portion 320 may connect a first portion 311 and a second portion 312.

As discussed previously, the metal layer 100 is disposed between the sealant 300 and the first substrate 10. The metal layer 100 is disposed in a lower portion of the sealant 300 and is formed to extend and surround the display area AA. As illustrated in FIG. 5B, the metal layer 100 includes a plurality of straight portions 110 formed to extend in a straight, e.g., linear, shape (or manner) and a plurality of curved portions 120 formed to extend in a curved shape (or manner) to connect the plurality of straight portions 110.

The straight portions 110 may include a first straight potion 111 and a second straight portion 112 extending in a direction perpendicular to the direction of the first straight portion 111. A length of the second straight portion 112 may be different from that of the first straight portion 111. For example, as illustrated in FIG. 5B, each curved portion 120 may connect a first portion 111 and a second portion 112. For example, in view of FIGS. 2 and 5B, the metal layer 100 may have a same shape as the sealant 300, as viewed in top plan view, and the sealant 300 may, e.g., completely, cover the metal layer 100.

The laser source LS moves radiating the laser beam B along a shape of the sealant 300 so as to heat and melt the sealant 300. For example, the laser source LS moves to sequentially radiate the laser beam B onto the first straight portions 311, the curve portions 320, and the second straight portions 312. The sealant 300 is firstly heated by radiating the laser beam B, and is secondly heated by the metal layer 100 disposed in the lower portion of the sealant 300. The second heating of the sealant 300 may be performed by thermal conductivity. A perimeter area of the sealant 300 having a lower temperature than that of a center area of the sealant 300 is heated by the second heating of the metal layer 100, and thus a temperature difference between the perimeter area and the center area may be reduced.

The laser source Ls moves at a uniform speed V along the shape of the sealant 300. When the laser source LS moves through, e.g., above, the straight portions 310, a moving speed of an inner part of the laser beam B, i.e., a part of the laser beam B facing toward the display unit 200, is the same as that of an outer part thereof, i.e., a part of the laser beam B facing toward the display unit 200. However, when the laser source LS moves through, e.g., above, the curved portions 320, the inner and outer parts of the laser source LS have different moving speeds.

Figure 6:
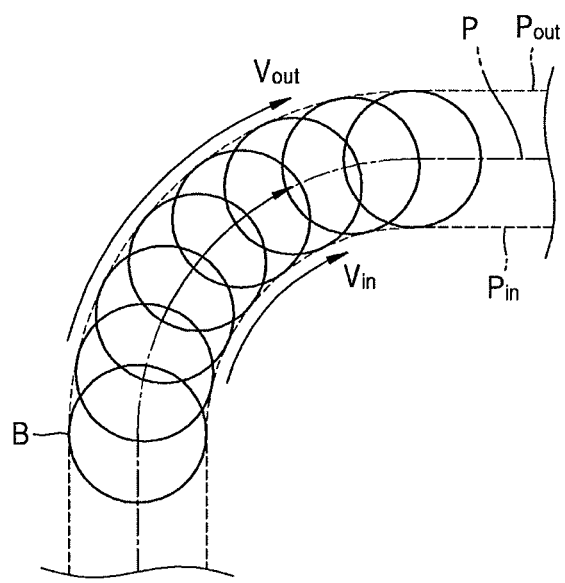
FIG. 6 illustrates a conceptual diagram for explaining a laser beam radiated when a laser source moves by passing through curve portions of a sealant.

FIG. 6 illustrates a conceptual diagram for explaining radiation of the laser beam B when the laser source LS moves by passing through the curve portions 320 of the sealant 300. In FIG. 6, when the laser beam B moves in a curved shape (or manner), P denotes a moving path of a center point of the laser beam B, and Pin and Pout denote moving paths of an outer line.

Referring to FIG. 6, when the laser source LS moves in the curved shape (or manner) at a predetermined speed V, the center point of the laser beam B radiated by the laser source LS moves at the predetermined speed V. A speed Vin of an inner part of the laser beam B is lower than the speed V of the center point thereof, whereas a speed Vout of an outer part of the laser beam B is faster than the speed V of the center point thereof. That is, the speed Vin of an inner part of the laser beam B is slower than the speed Vout of an outer part of the laser beam B.

As described above, when the laser beam B moves in the curved shape (or manner), the moving speed of the inner part of the laser beam B is slow. The laser source LS moves in the curved shape (or manner) along the curve portions 320 of the sealant 300 when passing by the curve portions 320, and thus the laser beam B is radiated onto inner areas of the curve portions 320 of the sealant 300 longer than outer areas thereof (due to the slower speed). As such, the laser beam B is focused in the inner areas of the curve portions 320 of the sealant 300.

In the present embodiment, considering that the laser beam B is focused in the inner areas of the curve portions 320 of the sealant 300, a structure of the curve portions 120 of the metal layer 100 disposed in a lower portion thereof is improved, thereby controlling the inner areas of the curve portions 320 of the sealant 300 to be overheated rather than the outer areas thereof by the laser beam B, as will be discussed in more detail below with reference to FIGS. 7-8B.

Figure 7:
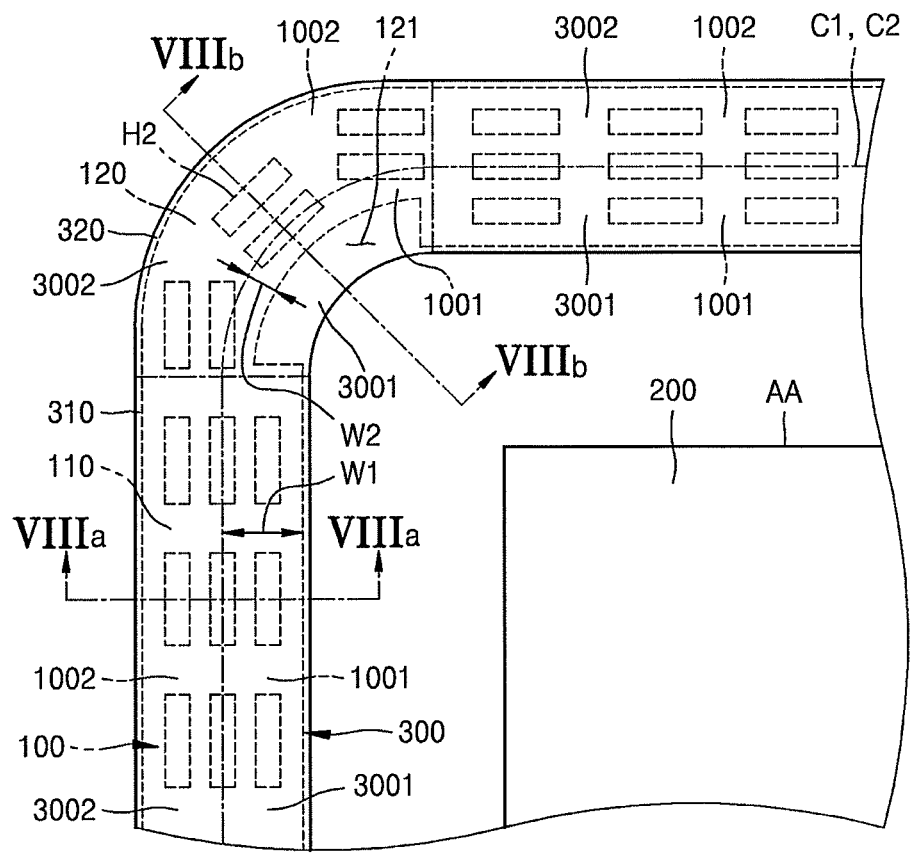
FIG. 7 illustrates an expanded plan view of a part of an organic light emitting display device, according to an embodiment.
Figure 8A:
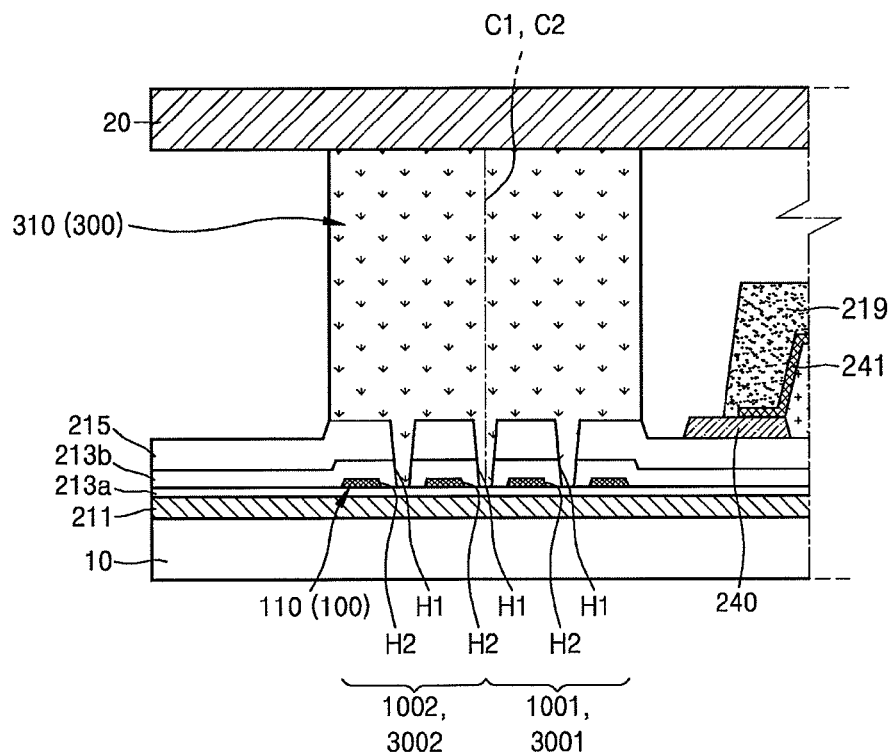
FIG. 8A illustrates an example of a cross-sectional view taken line VIIIa-VIIIa of the organic light emitting display device of FIG. 7.

FIG. 7 illustrates an expanded plan view of a part of an organic light emitting display device, according to an embodiment. FIG. 8A is an example of a cross-sectional view taken along a line VIIIa-VIIIa of the organic light emitting display device of FIG. 7. FIG. 8B is an example of a cross-sectional view taken along a line VIIIb-VIIIb of the organic light emitting display device of FIG. 7. For convenience of description, in FIG. 7, the first and second substrates 10 and 20, the buffer layer 211, and the insulating layers 213a, 213b, and 215 are omitted.

Referring to FIG. 7, the sealant 300 is formed to surround the display area AA. The sealant 300 includes the plurality of straight portions 310 and the plurality of curved portions 320 connecting the straight portions 310. The sealant 300 includes an inner area 3001 facing toward the display unit 200 in a width direction, and an outer area 3002 disposed along a perimeter of the inner area 3001. The inner area 3001 may be an area disposed inside with respect to a center liner C1 between inner and outer lines of the straight portions 310. The outer area 3002 may be an area disposed outside with respect to the center line C1 between the inner and outer lines of the straight portions 310.

The metal layer 100 is disposed in a lower portion of the sealant 300 to overlap with the sealant 300, and is formed to surround the display area AA. The metal layer 100 includes the plurality of straight portions 110 and the plurality of curve portions 120 connecting the plurality of straight portions 110.

The metal layer 100 includes an inner area 1001 facing toward the display unit 200 and an outer area 1002 disposed along a perimeter of the inner area 1001, in a width direction. The inner area 1001 may be an area disposed inside with respect to a center liner C2 between inner and outer lines of the straight portions 110. The outer area 1002 may be an area disposed outside with respect to the center line C2 between the inner and outer lines of the straight portions 110. The center line C2 of the metal layer 100 may be identical to the center line C1 of the sealant 300 but is not limited thereto. The center line C2 of the metal layer 100 may not be identical to the center line C1 of the sealant 300.

Referring to FIGS. 7 and 8A, the straight portions 110 of the metal layer 100 are disposed in lower portions of the straight portions 310 of the sealant 300. The plurality of openings H2 are formed in the straight portions 110 of the metal layer 100 at a predetermined space. The inner area 1001 and the outer area 1002 may have symmetrical shapes in the straight portions 110 of the metal layer 100. Thus, the inner area 3001 and the outer area 3002 of the straight portions 310 of the sealant 300 are diagonally heated by the metal layer 100. In other words, when a laser beam is radiated onto the straight portions 310 of the sealant 300, an amount of heat transferred from the straight portions 110 of the metal layer 100 to the straight portions 310 of the sealant 300 is substantially the same in the inner area 3001 of the sealant 300 and the outer area 3002 thereof.

Figure 8B:
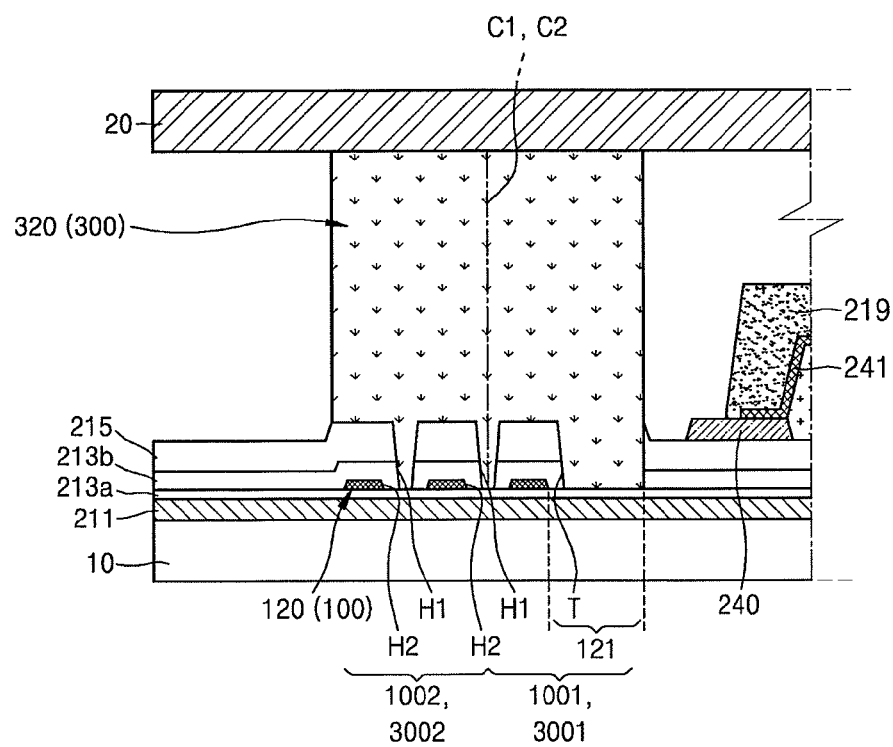
FIG. 8B illustrates an example of a cross-sectional view taken along line VIIIb-VIIIb of the organic light emitting display device of FIG. 7.

Referring to FIGS. 7 and 8B, the curved portions 120 of the metal layer 100 are disposed in lower portions of the curve portions 320 of the sealant 300. At least a part of the inner area 1001 is removed from the curved portions 120 of the metal layer 100, as compared to the straight portions 110 of the metal layer 100. That is, a groove 121 is formed in the inner area 1001 of the curve portions 120 of the metal layer 100, so the inner area 1001 of the metal layer 100 in the curved portion 120 does not overlap the entire inner area 3001 of the sealant 300 at the curved portion 320 (see dashed line in FIG. 7 indicating a narrower area 1001 with a width W2). As such, as illustrated in FIG. 8B, a portion of the inner area 3001 of the sealant 300 contacts the first gate insulating film 213a rather than the metal layer 100.

Widths of the curved portions 120 of the metal layer 100 are smaller than those of the straight portions 110 of the metal layer 100. The width W2 of the inner area 1001 of the curve portions 120 of the metal layer 100 is smaller than a width W1 of the inner area 1001 of the straight portions 120 of the metal layer 100. The inner area 1001 and the outer area 1002 may have asymmetrical shapes in the curved portions 120 of the metal layer 100.

The inner area 3001 and the outer area 3002 of the straight portions 310 of the sealant 300 are asymmetrically heated by the metal layer 100 having the structure described above. In more detail, when the laser beam is radiated onto the sealant 300, an amount of heat transferred to the curved portions 320 of the sealant 300 from the curved portions 120 of the metal layer 100 is smaller in the inner area 3001 of the sealant 300 than in the outer area 3002 of the sealant 300, due to the groove 121, i.e., which includes no metal. As such, the inner area 3001 is prevented from being overheated in the curved portions 320 of the sealant 300, and the sealant 300 is prevented from diffusing toward the display unit 200.

As described previously with reference to FIG. 6, the laser beam B is focused in the inner area 3001 of the curve portions 320 of the sealant 300 according to a characteristic of a curve movement of the laser source LS. Thus, energy firstly transferred to the sealant 300 by the laser beam B is greater in the inner area 3001 of the curve portions 320 of the sealant 300 than in the outer area 3002. However, at least a part of the inner area 1001 of the curve portions 120 of the metal layer 100 is removed as described above, and thus energy secondly transferred to the sealant 300 by the metal layer 100 is greater in the outer area 3002 of the curve portions 320 of the sealant 300 than in the inner area 3001 (contrary to the firstly transferred energy). Thus, the asymmetrical energy firstly transferred to the sealant 300 may be offset by the energy secondly transferred to the sealant 300.

Meanwhile, the insulating layers 213a, 213b, and 215 are disposed between the first substrate 10 and the sealant 300. At least a part of the insulating layers 213a, 213b, and 215 is formed to cover the metal layer 100. For example, the second gate insulating film 213b and the interlayer insulating film 215 are formed to cover the metal layer 100.

Referring to FIG. 8B, the insulating layers 213b and 215 are disposed in the lower portions of the curve portions 320 of the sealant 300 and formed to cover the curved portions 120 of the metal layer 100. A trench T is formed in a location of the insulating layers 213b and 215 corresponding to the groove 121 of the curved portions 120 of the metal layer 100. The trench T may be disposed in a lower portion of the inner area 3001 of the curved portions 320 of the sealant 300 and may prevent the sealant 300 from unintentionally diffusing toward the display unit 200.

The insulating layers 213b and 215 include the plurality of openings H1 into which the sealant 300 is inserted. A width of the trench T may be equal to or greater than two times of width of the opening H1 outermost disposed among the plurality of openings H1. The width of the trench T is disposed in the lower portion of the sealant 300 and thus is smaller than that of the sealant 300. When the widths of the openings H1 and the trench T are different in a depth direction, widths of the openings H1 and the trench T may mean an average width.

The plurality of openings H1 and the trench T may be used to increase a contact area between the insulating layers 213b and 215 and the sealant 300, and simultaneously, to prevent the sealant 300 from unintentionally diffusing toward the display unit 200.

Meanwhile, although a trench structure in which the sealant 300 is inserted toward a first substrate in the above-described embodiment, another structure may be employed as long as the sealant 300 is prevented from diffusing in an inner direction toward the display unit 200. For example, although not shown, a dam protruding from upper portions of the insulating layers 213b and 215 may be formed so as to prevent the sealant 300 from diffusing in the inner direction.

Figure 9:
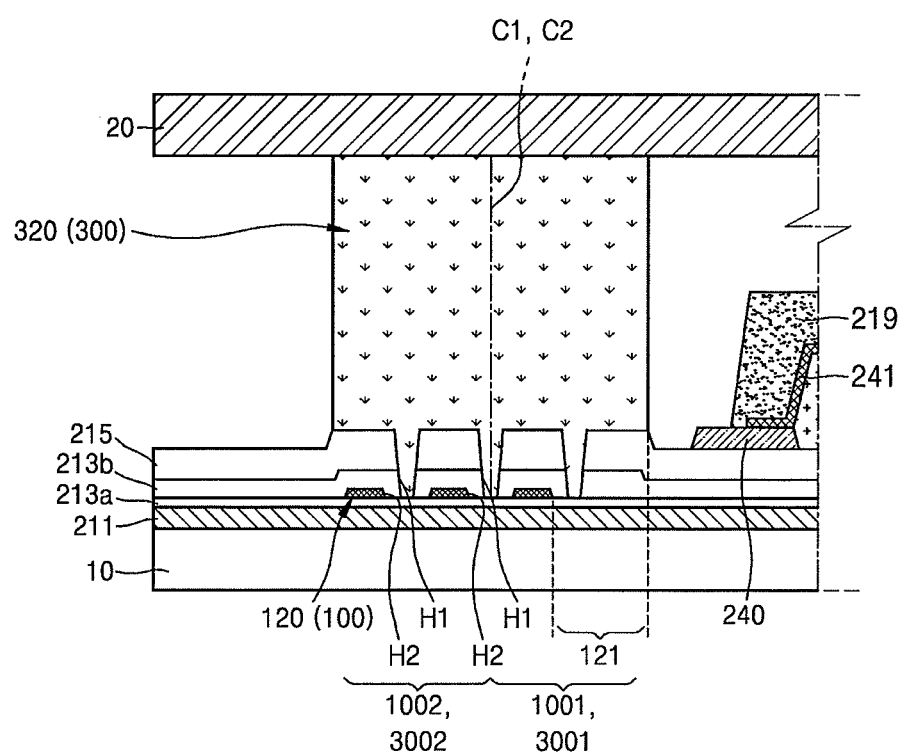
FIG. 9 illustrates another example of a cross-sectional view taken along the line VIIIb-VIIIb of the organic light emitting display device of FIG. 7.

The trench T may be a selective element. Accordingly, like the above-described embodiment, the trench T may be formed in the groove 121 or as shown in FIG. 9, the trench T may not be formed in the groove 121.

Figure 10A:
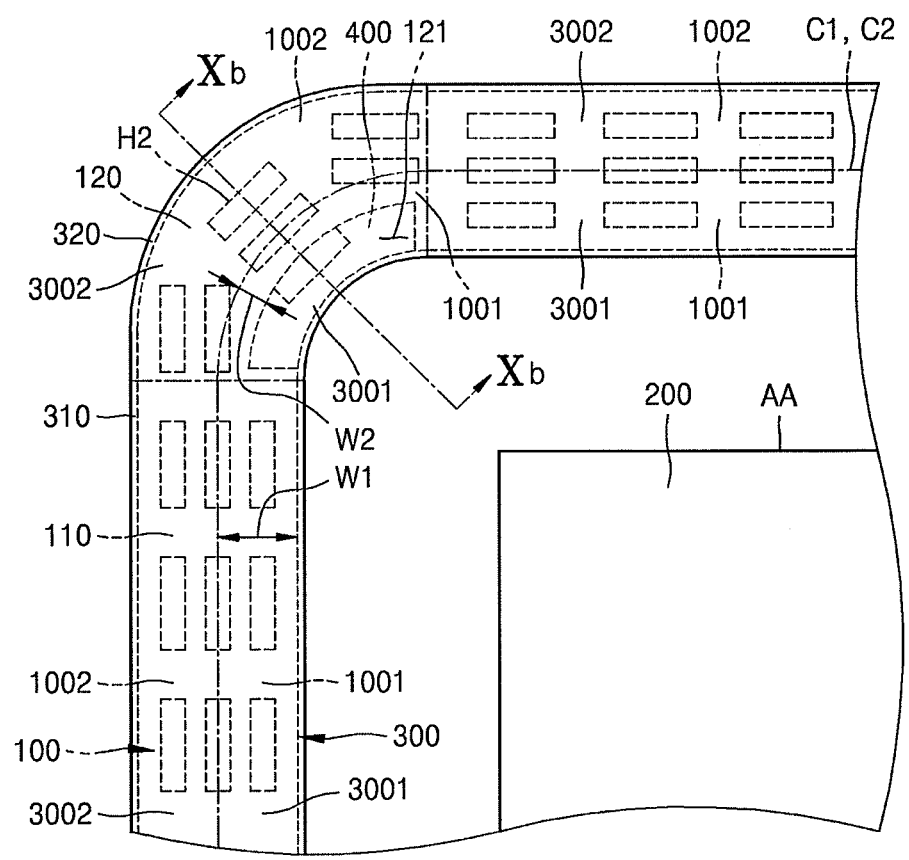
FIG. 10A illustrates an expanded plan view of a part of an organic light emitting display device, according to another embodiment.
Figure 10B:
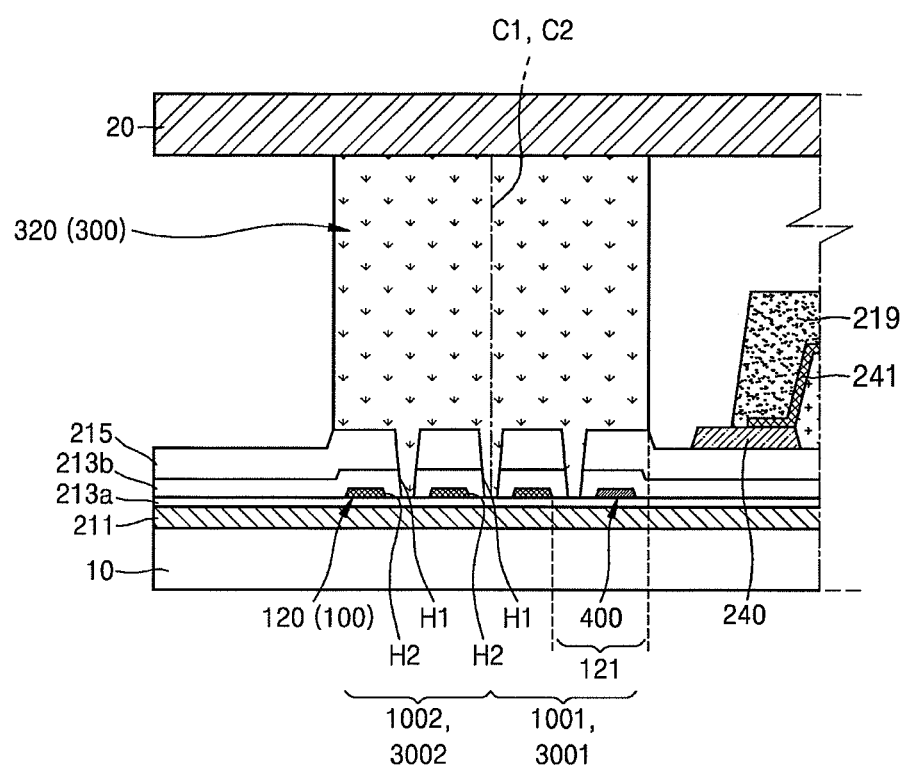
FIG. 10B illustrates an example of a cross-sectional view taken along line Xb-Xb of the organic light emitting display device of FIG. 10A.

FIG. 10A illustrates an expanded plan view of a part of an organic light emitting display device, according to another embodiment. FIG. 10B is an example of a cross-sectional view taken along line Xb-Xb of the organic light emitting display device of FIG. 10A.

Differences between the embodiment of FIG. 7 and the present embodiment will be described. In this regard, the same reference numerals denote the same elements.

Referring to FIGS. 10A and 10B, the sealant 300 is formed to surround the display area AA. The sealant 300 includes the plurality of straight portions 310 and the plurality of curved portions 320 connecting the straight portions 310.

The metal layer 100 is disposed in a lower portion of the sealant 300 and is formed to surround the display area AA. The metal layer 100 includes the plurality of straight portions 110 and the plurality of curved portions 120 connecting the straight portions 110.

The curved portions 120 of the metal layer 100 are disposed in lower portions of the curved portions 320 of the sealant 300. The groove 121 by which at least a part of the inner area 1001 is removed is formed in the curved portions 120 of the metal layer 100 compared to the straight line 110 of the metal layer 100. A low conductivity member 400 formed of a material having a lower thermal conductivity than that of a material of the outer area 1002 is disposed in the groove 121. For example, the outer area 1002 of the metal layer 100 may include molybdenum (Mo), and the low conductivity member 400 may include chromium (Cr) having a lower thermal conductivity than that of molybdenum (Mo).

In the curved portions 120 of the metal layer 100, the inner area 1001 including the low conductivity member 400 has a lower thermal conductivity than that of the outer area 1002. Thus, the inner area 1001 of the curve portions 120 of the metal layer 100 transfers a lower energy to the curved portions 320 of the sealant 300, compared to the outer area 1002 thereof. Therefore, asymmetrical energy focused in the inner area 1001 of the curved portions 320 of the sealant 300 by the laser beam B moving in a curved shape (or manner) may be offset.

Figure 11A:
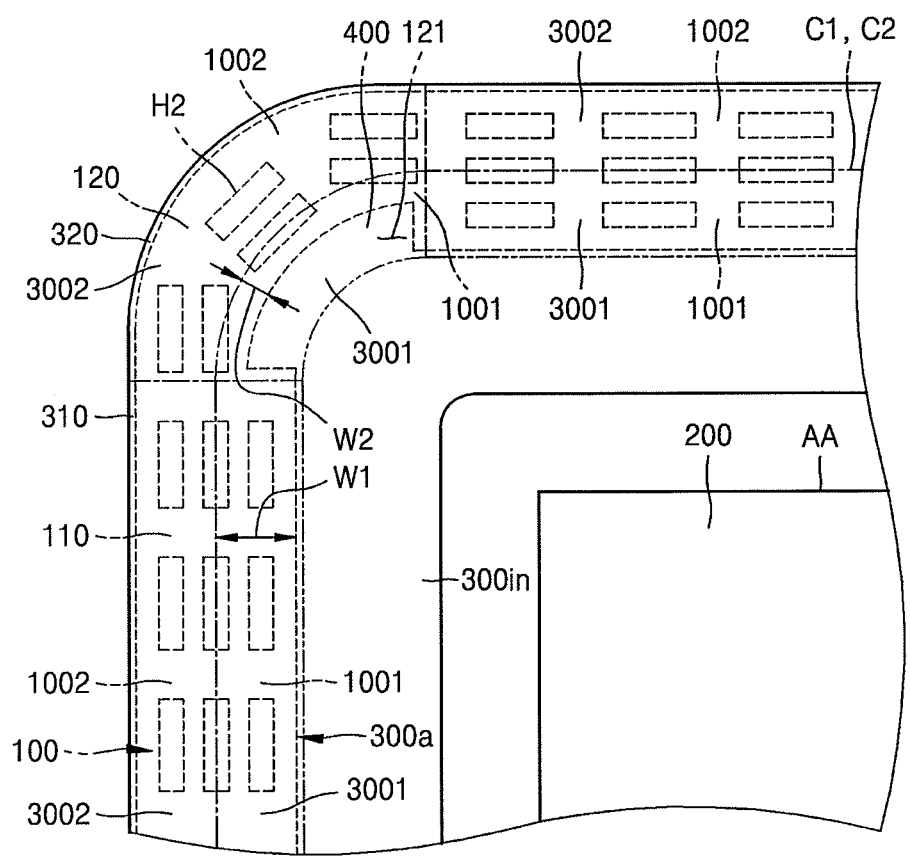
FIGS. 11A and 11B illustrate expanded plan views of a part of an organic light emitting display device, according to another embodiment.
Figure 11B:
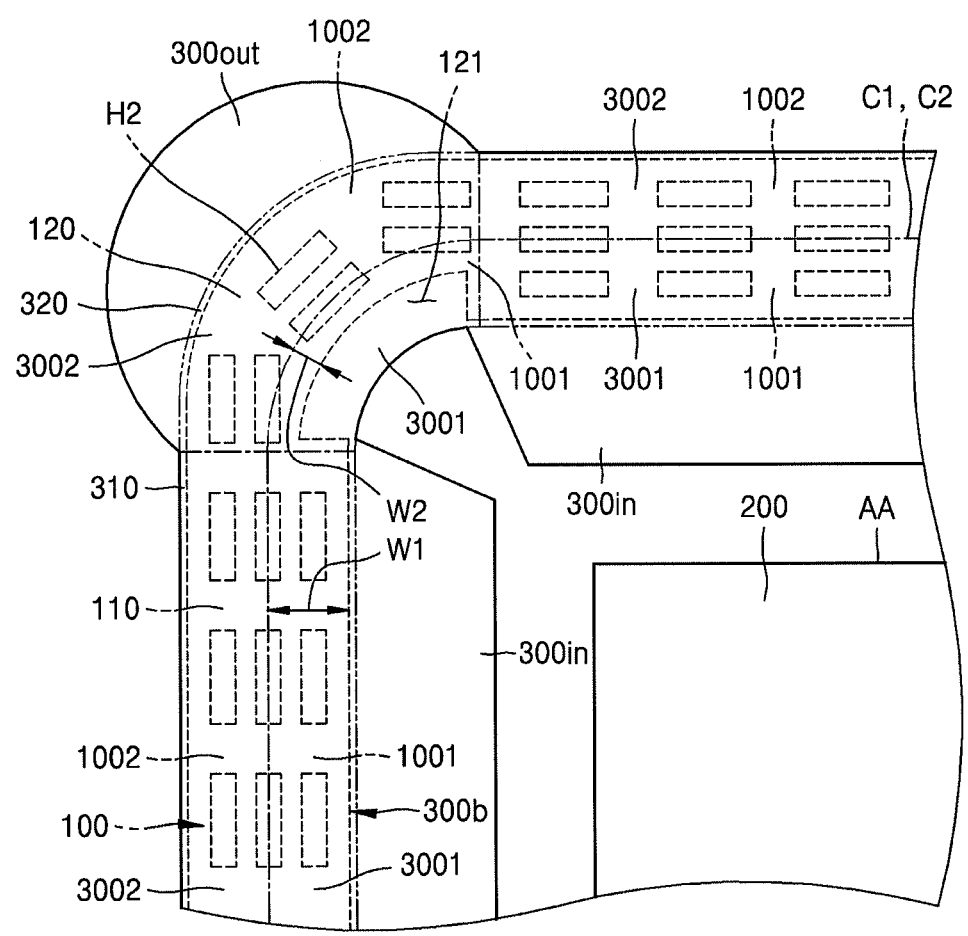

FIGS. 11A and 11B illustrate expanded plan views of a part of an organic light emitting display device, according to other embodiments.

Referring to FIG. 11A, the sealant 300a includes the first extension sealant 300in extending in the inner direction, i.e., toward the display unit 200. The first extension sealant 300in may overlap with at least a part of the circuit patterns 240 and 241 (FIG. 4). A contact area by the sealant 300a may be extended by the first extension sealant 300in, thereby increasing the bonding force of the first and second substrates 10 and 20.

Referring to FIG. 11B, the straight portions 310 of a sealant include the first extension sealant 300in extending in the inner direction. The curved portions 320 of the sealant include a second extension sealant 300out extending in an outer direction. The curve portions 320 of the sealant 300*b* may not include the first extension sealant 300in extending in the inner direction.

As described above, according to the one or more of the above embodiments, an organic light emitting display device includes a metal layer under a sealant, while at least a part of an inner area in a curved portion of the metal layer is removed, thereby easily controlling a sealing width of the sealant. The modified sealing width of corner regions of the sealant during a process of bonding upper and lower substrates to each other improves bonding in the organic light emitting display device and increases product reliability. These general and specific embodiments may be implemented by using a system, a method, a computer program, or a combination thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising: a first substrate; a second substrate facing the first substrate; a display unit defining a display area on the first substrate; a metal layer on the first substrate, the metal layer including: a plurality of first straight portions, and a plurality of first curved portions connecting the plurality of first straight portions, the plurality of first straight and curved portions of the metal layer being arranged to surround the display area; and a sealant bonding the first substrate and the second substrate, the sealant at least partially being on the metal layer and including: plurality of second straight portions, and a plurality of second curved portions connecting the plurality of second straight portions, the plurality of second straight and curved portions of the sealant being arranged to surround the display area, wherein the metal layer is below the sealant such that the metal layer is arranged to transfer heat to the sealant, and wherein the metal layer includes an inner area extending from a center line of the metal layer to a respective innermost extent of the metal layer and facing toward the display unit, and an outer area outside the inner area in a width direction, the width of the inner area in the first curved portions being smaller than the width of the inner area in the first straight portions.

2. The organic light emitting display device as claimed in claim 1, further comprising a groove in the inner area of the plurality of first curved portions of the metal layer.

3. The organic light emitting display device as claimed in claim 1, wherein widths of the plurality of first curved portions of the metal layer are smaller than widths of the plurality of first straight portions of the metal layer.

4. The organic light emitting display device as claimed in claim 3, wherein a distance from the display unit to the inner area of each of the plurality of first curved portions of the metal layer is larger than a distance from the display unit to the inner area of each of the plurality of first straight portions of the metal layer.

5. The organic light emitting display device as claimed in claim 1, wherein:
the sealant includes an inner area facing toward the display unit and an outer area disposed outside the inner area in a width direction, and
when a laser beam is radiated onto the sealant, an amount of heat transferred to the plurality of second curved portions of the sealant from the metal layer is smaller in the inner area of the sealant than in the outer area of the sealant.

6. The organic light emitting display device as claimed in claim 5, wherein, when the laser beam is radiated onto the sealant, an amount of heat transferred to the plurality of second straight portions of the sealant from the metal layer is substantially the same in the inner area of the sealant and in the outer area of the sealant.

7. The organic light emitting display device as claimed in claim 1, further comprising an insulating layer between the first substrate and the sealant, the insulating layer at least partially covering the metal layer.

8. The organic light emitting display device as claimed in claim 7, wherein the insulating layer covers the plurality of first curved portions of the metal layer, a trench, into which the sealant is inserted, penetrating the insulating layer at a positioned between the inner area of the metal layer and the display unit.

9. The organic light emitting display device as claimed in claim 8, wherein;
the insulating layer covers the plurality of first curved portions of the metal layer, and includes a plurality of openings into which the sealant is inserted, and
a width of the trench is equal to or greater than two times of a width of an outermost opening from among the plurality of openings.

10. The organic light emitting display device as claimed in claim 1, further comprising a low conductivity member in the inner area of the plurality of first curved portions of the metal layer, the low conductivity member including a material having a thermal conductivity that is lower than a thermal conductivity of the outer area of the plurality of first curved portions of the metal layer.

11. The organic light emitting display device as claimed in claim 1, wherein the sealant further comprises a first extension sealant overlapping with at least a part of a signal wiring for applying a signal to the display unit.

12. The organic light emitting display device as claimed in claim 1, wherein the plurality of second curved portions of the sealant further comprise a second extension sealant disposed outside the plurality of first curved portions of the metal layer.

13. The organic light emitting display device as claimed in claim 2, wherein the groove in the inner area of the plurality of first curved portions of the metal layer includes no metal.

14. The organic light emitting display device as claimed in claim 1, wherein the first curved portions include areas in which metal extends from the respective innermost extent to a respective outer line of the metal layer, the first curved portions of the metal layer having respective cut away regions that define the respective innermost extent.

* * * * *